United States Patent [19]

Butterweck et al.

[11] 4,034,196
[45] July 5, 1977

[54] DIGITAL SIGNAL PROCESSING DEVICE WITH QUANTIZER

[75] Inventors: Hans-Jurgen Butterweck, Akert; Theodoor Antonius Carel Maria Claasen, Eindhoven; Wolfgang Friedrich Georg Mecklenbrauker, Eindhoven; Johannes Bernhard Heinrich Peek, Eindhoven, all of Netherlands

[73] Assignee: U.S. Philips Corporation, New York, N.Y.

[22] Filed: Oct. 23, 1975

[21] Appl. No.: 625,183

[30] Foreign Application Priority Data
Nov. 14, 1974 Netherlands .................. 7414848

[52] U.S. Cl. ........................................... 235/156
[51] Int. Cl.² ........................................ G06F 7/38
[58] Field of Search ............ 235/152, 156, 150.4; 325/42; 328/167; 331/187

[56] References Cited
UNITED STATES PATENTS

| 3,609,568 | 9/1971 | Jackson | 328/167 |
| 3,725,687 | 4/1973 | Heightley | 235/164 |
| 3,749,895 | 7/1973 | Chih-Yu Kao | 235/152 |

OTHER PUBLICATIONS

S.R. Parker et al., "Limit–Cycle Oscillations in Digital Filters" *IEEE Trans. on Ckt. Theory* vol. ct–18 No. 6, Nov. 1971, pp. 687–697.

*Primary Examiner*—David H. Malzahn
*Attorney, Agent, or Firm*—Frank R. Trifari; Daniel R. McGlynn

[57] ABSTRACT

A digital signal processing device of the recursive type, such as a recursive digital filter or a digital oscillator, comprising a storage device for storing at least one first code word related to an output code word, multiplying means for multiplying said first code word by a given weighting factor for generating a second output code word, a controlled quantizer which applies rounding or magnitude truncation upon said second code word in response to a third code word which is related to said first code word.

5 Claims, 5 Drawing Figures

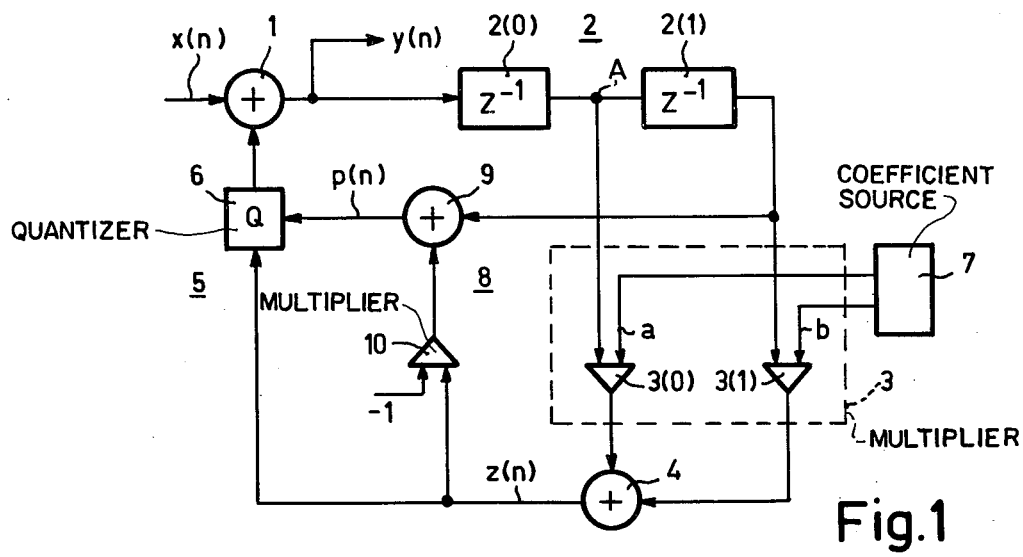
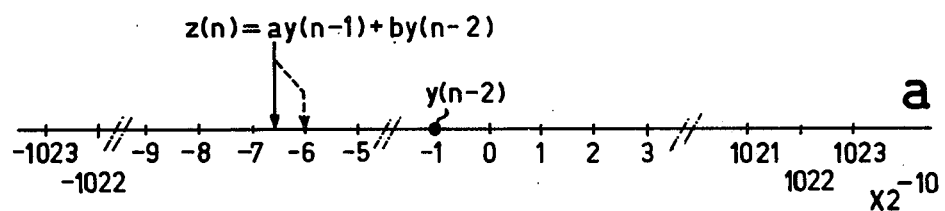
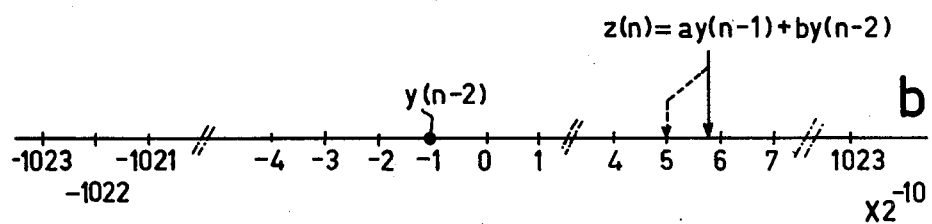
Fig.2

DIGITAL SIGNAL PROCESSING DEVICE WITH QUANTIZER

BACKGROUND OF THE INVENTION

The invention relates to a digital signal processing device for generating output code words, comprising a storage device for the storage and retrieval of at least one code word related to an output code word; a series circuit of multiplying means and first combination means, to which multiplying means last mentioned code word and at least one second code word which is also related to an output code word are applied as well as weighting factors by which series circuit code words are generated which are supplied to a feedback circuit including a quantizer circuit, having an output coupled to an input of said storage device.

Such a signal processing device may function as a recursive digital filter in which a digital input signal is supplied to this device and the weighting factors are chosen in accordance with the transfer characteristic of the filter to be realized. A similar device can also function as a digital oscillator, in the case in which no input signal is available.

As is known, recursive digital filters may be constituted by a number of the signal processing devices described above and arranged in cascade. Each of said devices is then in the form of a second-order recursive digital filter. In a so-called direct form two a recursive part of such a second-order recursive digital filter comprises two storage sections in which, for example, mutually delayed versions of the output code words are stored. In a multiplier these code words are multiplied by weighting factors, the so-called filter coefficients and the products so obtained are added in a first adder. The sum of products obtained in this way is thereafter added in a second adder to an input code word and the result is written into the first storage section, and the code word which was originally stored in this first storage section, is shifted to the second storage section.

Besides this embodiment of a recursive digital filter the literature also discusses, for example, the so-called direct form one of which is the so-called direct transpose configuration of the direct form two. This latter embodiment is derived from the form described above by reversing the signal direction therein and by replacing the nodes, which are present by adders, and the adders, which are present by nodes.

If the signal processing device described above is utilized as a digital oscillator then it may be realized in the same way as the second-order recursive digital filter described above. As no input signal is supplied to such an oscillator, the said second adder can be dispensed with.

In general the above-mentioned code words and weighting factors represent numbers which are expressed in the binary system. Each of these numbers then consists of a plurality of bits which each represent a specific power of two. Instead of the expression code words the expression numbers will be used in what follows hereinafter.

As has been stated already hereinbefore both in a digital filter and in a digital oscillator two numbers are each time multiplied together. When two numbers, which are given in the binary system are multiplied, a number is obtained which generally consisting of a number of bits which is larger than the number of bits of each of the numbers to be multiplied. Consequently, for storing successive products in the first storage section a storage section of increasing capacity is required for each multiplication.

In order to limit the storage capacity of the storage section to a specific number of bits, the numbers supplied by the first adder are each time quantized in the quantizer. Consequently each number of, for example, $m+r$ bits supplied by the first adder is converted to a number of $m$ bits. This limitation of the number length can be realized in conformity with the principles of rounding. The $m+r$-bits number which is located between two $m$-bits numbers is then replaced by that $m$-bits number whose magnitude is nearest to the $m+r$-bits number.

Due to its non-linear character such a quantization results, in many cases, in instabilities in the device under consideration. In a recursive digital filter, quantization results in so-called limit cycles i.e. spontaneous oscillations in the absence of an input signal or in the presence of a periodical input signal.

In a digital oscillator quantization results in the generation of a signal whose amplitude does not correspond to a specific desired value.

The article: "Second-order digital filter with only one magnitude-truncation quantizer and having practically no limit cycles", in Electronics Letters, Nov. 1, 1973, volume 9, No. 22, pages 531–532 shows how the stability of a recursive digital filter can be increased by limiting the length of $m+r$-bits numbers by means of magnitude truncation. In that case, the $m+r$-bits numbers, if they have not been given as such, are converted to numbers which are given in sign and magnitude as well as in fixed-point representation, and thereafter those bits are discarded which are less significant than the least significant bit of the first $m$ significant bits of this number.

For a digital oscillator it is also known to increase its stability. By replacing each $m+r$-bit number by the $m$-bits number whose magnitude is nearest to the $m+r$-bit number and greater than the $m+r$-bit number.

Because of this increase in stability of signal processing devices described above, a considerable extension of its range of application has been realized. If, however, this signal processing device is implemented as a recursive digital filter, limit cycles will still occur at specific values of the filter coefficients. If it is implemented as a digital oscillator, then the generation of the signal of the desired amplitude may still stop spontaneously when a small disturbance occurs.

It is an object of the invention to provide a further improvement of the stability of the signal processing devices described above.

SUMMARY OF THE INVENTION

In accordance with the invention, the quantizer is controlled by a control circuit comprising second combination means to which code words are supplied which are related to said code words supplied to the multiplying means, the output circuit of these combination means being coupled to a control input circuit of said quantizer for quantizing, in dependence on the code words supplied by the second combination means, the code words supplied by the first combination means.

If the digital signal processing device is as a recursive digital filter, then it is absolutely free of limit cycles due to the measures according to the invention; if it is a digital oscillator then it can generate a periodical signal of only one predetermined amplitude.

BRIEF DESCRIPTION OF THE DRAWING

FIG. 1 shows a second-order recursive digital filter provided with the measures according to the invention;

FIG. 2 shows diagrams to explain the operation of the filter of FIG. 1;

Figure 3:
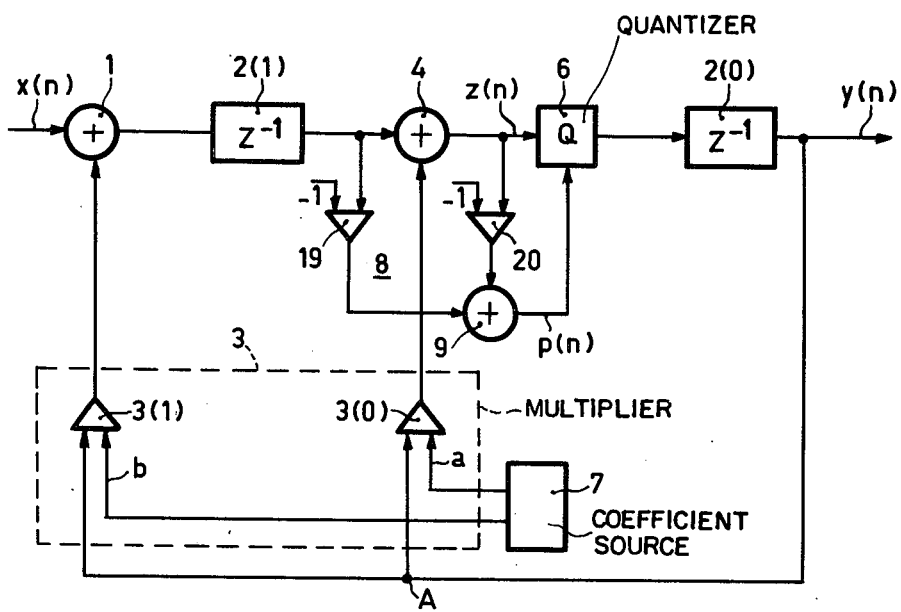
FIG. 3 shows the transpose configuration of the digital filter shown in FIG. 1.

REFERENCES a. Terminology in digital signal processing; IEEE Transactions on Audio and Electroacoustics, Vol. AU-20, No. 5, December 1972, pages 322-337.

b. Digital processing of signals; B. Gold and C. M. Rader, McGraw-Hill Book Company 1969.

c. Digitale Systeme zur Signalverarbeitung; H. W. Schussler; Springer-Verlag 1973.

d. Control System Synthesis; J. G. Truxal; McGraw-Hill Book Company 1955, pages 641-645.

e. Limit cycle oscillations in digital filters; S. R. Parker; S. F. Hess; IEEE Transactions on circuit theory, Vol. CT-18, No. 6, November 1971, pages 687-697 (FIG. 3 in particular).

f. Theory and application of Liapunov's direct method; W. Hahn; Prentice-Hall, 1963, pages 146-150.

g. A non-linear digital oscillator; H. D. Montgomery; Proceedings of the IEEE International Conference on Communications, Philadelphia 10-21/6, 1972, pages 33-3 to 33-8.

h. Limit cycles due to adder overflow in digital filters; A. N. Willson; IEEE Transactions on circuit theory, Vol. CT-19, No. 4, July 1972, pages 342-346.

i. Overflow oscillations in digital filters; P. M. Ebert, J. E. Mazo, M. G. Taylor; The Bell System Technical Journal, November 1969, pages 2999-3020 (FIG. 8).

j. A new approach to the realization of non-recursive digital filters; A. Peled, B. Liu; IEEE Transactions on audio and electro-acoustics, Vol. AU-21. No. 6, December 1973.

DESCRIPTION OF THE PREFERRED EMBODIMENT

1. The device in general

FIG. 1 shows a second-order and pure recursive digital filter for realizing a predetermined transfer characteristic. Said filter comprises an input circuit 1 in the form of a first adder. The output of this adder 1 is coupled to a storage device 2 which in this embodiment is formed by a cascade circuit of two delay sections 2(o) and 2(1) each having a delay time T. The outputs of these delay sections are connected to inputs of a multiplying device 3. In this embodiment this multiplying device is formed by two multipliers 3(o) and 3(1), an input of each of which is connected to the respective outputs of the delay sections 2(o) and 2(1). The outputs of these multipliers 3(o) and 3(1) are coupled to inputs of a second adder 4 whose output is connected to a feedback circuit 5 in which a quantizer 6 has been included and whose output is connected to a first input of said adder 1.

In the embodiment shown a digital information signal $x(n)$ is supplied via a second input to adder 1 which information signal is formed by a sequence of binary numbers occurring at instants $t = nT$ with $n = 0, 1, 2, 3, \ldots$ and with a frequency $1/T$. These numbers represent, for example the magnitude and polarity of an analog signal at an instant $t = nT$.

It should be observed that the delay time of each of the delay sections 2(o) and 2(1) is equal to the reciprocal value of the frequency at which the binary numbers $x(n)$ occur.

By this pure recursive filter, output numbers are generated which are indicated by $y(n)$ in the figure and which are here derived from the output of adder 1. Consequently the delay sections 2(o) and 2(1) contain delayed versions of the output numbers. These delayed versions may be indicated by $y(n-1)$ and $y(n-2)$ respectively. These latter numbers are multiplied in multipliers 3(o) and 3(1) respectively by the respective filter coefficients $a$ and $b$ which are normally derived from a source 7. The products $a \cdot y(n-1)$ and $b \cdot y(n-2)$ obtained in this manner are summed in adder 4. Consequently this adder supplies the number $z(n) = a \cdot y(n-1) + b \cdot y(n-2)$.

For simplicity it is assumed that the numbers $x(n)$, $y(n)$, $y(n-1)$, $y(n-2)$, $z(n)$, as well as the filter coefficients $a$ and $b$ are given in fixed point representation and in sign and magnitude representation and that, each of these numbers comprises, besides a polarity bit, for example, 10 bits which indicate the magnitude of the number. The latter bits will hereinafter be indicated by "magnitude-bits".

As the bits of various numbers may occur both in series and in parallel, no distinction is made neither in the figures nor in the description between numbers whose bits occur in series or in parallel.

2. Detailed description of the device

By multiplying the numbers $y(n-1)$ and $y(n-2)$ by the respective filter coefficients $a$ and $b$, numbers are obtained which each comprise twenty magnitude bits and a polarity bit. After addition of these numbers, the result is supplied to quantizer 6 which quantizes this number and limits it to a number having only ten magnitude-bits which can be stored again in the delay sections 2(o) and 2(1). According to the invention this quantizer 6 is controlled by a control circuit 8 which in the embodiment of FIG. 1 comprises a third adder 9 to which the number $y(n-2)$ stored in the delay section 2(1) and the output number of the adder 4 after being multiplied by a factor minus one are supplied. Said last multiplication is obtained by means of a multiplier 10, a first input of which is connected to the output of adder 4 and to which, via a second input, a coefficient $-1$ is supplied which is also, for example, supplied by source 7. This multiplication may also be realized by reversing the sign bit of the number supplied by adder 4; for example by means of an inverter.

The adder 9 now supplies a number $p(n)$ which is equal to the algebraic sum of the numbers $y(n-2)$ and $-[ay(n-1) + by(n-2)]$. In dependence upon $p(n)$ the number $z(n)$ supplied by adder 4 is quantized, i.e. converted to a number $z_{k2}(n)$ which satisfies the following equation:

$$z_{k2}(n) = ay(n-1) + by(n-2) + E_n,$$

where $E_n$ is the quantizing error.

If more in particular the number $p(n)$ is positive ($p(n) > 0$), i.e. if $y(n-2) > z(n)$ then the number $z(n)$ is rounded upwards. If $p(n)$ is negative $(p(n) < 0)$, i.e. if $y(n-2) < z(n)$, the number $z(n)$ is rounded downwards, if $p(n) = 0$, $z(n)$ need not be quantized as $z(n)$ then has the correct word length.

FIG. 2 is a diagrammatic representation of the quantization in the recursive digital filter of FIG. 1. Both in $a$ and $b$ in FIG. 2 integer multiples of $2^{-10}$ are indicated along a horizontal axis. Let us assume that the numbers stored in the storage section 2(o) and 2(1) can have these quantized values only. In these figures the solid arrow indicates the location of the non-quantized output number $z(n) = ay(n-1) + by(n-2)$ of adder 4. In $a$ in FIG. 2 $z(n)$ is located between the values $-7.2^{-10}$ and $-6.2^{-10}$. As $y(n-2)$ has the value $-2^{-10}$ now and consequently is larger than $z(n)$, the output number $z_{kw}(n)$ of quantizer 6 becomes equal to $-6.2^{-10}$. So $z(n)$ rounded upwards. This rounding is diagrammatically shown in the figure by the dashed arrow. In $b$ in FIG. 2 the value of $z(n)$ is located between the values $+5.2^{-10}$ and $+6.2^{-10}$, while $y(n-2)$ again has the value $-2^{-10}$. As in this case $y(n-2)$ is smaller than $z(n)$, $z_{k2}(n)$ becomes equal to $+5.2^{-10}$, so that the number $z(n)$ is rounded downwards.

Unlike the known principle of rounding of a number, in the device according to the invention the direction into which a number is rounded is not determined by the number to be rounded itself but by the location of this number with respect to a reference number, namely in this embodiment by the number $y(n-2)$.

Using the above measures, according to the invention it is achieved that the polarity of the rounding error $E_n$ at all times is equal to the polarity of the number $p(n)$ supplied by adder 9. In this way a recursive digital filter has been realized in which only two types of limit cycles can still occur, namely that limit cycle having period T and that limit cycle having period 2T. Even with respect to the recursive digital filter described in the preamble and in which the quantizer is constituted by a magnitude truncation device which gave particularly good results, the numbers of different limit cycles which can still occur are reduced to a considerable extent when the measures according to the invention are applied while furthermore it is already known in advance which limit cycle will occur. Namely, only the limit cycle of the period occurs if the filter coefficient $a$ exceeds zero and if simultaneously the filter coefficient $b$ is smaller than zero, while only the limit cycle of the period 2T occurs if both filter coefficients $a$ and $b$ are smaller than zero.

That with the measures according to the invention a recursive digital filter has been realized which is stable to the extent indicated above, can be provided by an energy concept which is analogous to that discussed in references (f) and (h). Starting point for this concept is a so-called energy matrix, at the form $$w = \begin{bmatrix} 1-b & -a \\ -a & 1-b \end{bmatrix}$$

Said energy concept leads to the conditions $E_n[y(n-2) - ay(n-1) - by(n-2)] \geq 0$, which the signals and the quantizing error $E_n$ must satisfy in order to realise a stable recursive digital filter and which is satisfied by means of the above described measures according to the invention.

For many practical uses of the described recursive digital filter and in particular if a series circuit of a digital-to-analog converter and an analog low-pass filter is connected to the output of the filter, the two remaining limit cycles of the period T or 2T respectively are, however, not annoying. In a further digital processing of the output numbers of the described recursive filter, for example, when these output numbers are digitally modulated, also these two limit cycles of the period T and 2T can cause undesired disturbing phenomena.

Further to the measures according to the invention a recursive digital filter can be realized in which even said limit cycles of the periods T and 2T do not occur anymore so that thus a stable recursive digital filter has been realized for all combinations of filter coefficients $a$, $b$, which are situated within the so-called region of absolute stability (see FIG. 3 of reference $e$).

In what follows hereinafter the notion quantizing step is used, which step will be indicated by $q$. The term quantization step must be understood to mean the value of the least significant bit of the numbers stored in the delay sections 2(o) and 2(1). In the foregoing it was assumed that in these delay devices numbers having ten magnitude bits can be stored, these numbers having been given in sign and magnitude, as well as in fixed-point representation. The successive bits therefore have the values $(\frac{1}{2})^1$; $(\frac{1}{2})^2$; $(\frac{1}{2})^3$; ... $(\frac{1}{2})^9$; $(\frac{1}{2})^{10}$, so that for these numbers the quantizing step has the value $q = (\frac{1}{2})^{10}$.

Further to the above described measures according to the invention the quantizer 6 is not only constituted for rounding, but also for applying magnitude truncation on a number supplied by adder 4.

If in the digital filter shown in FIG. 1, the output number $p(n)$ of adder 9 is greater than or equal to the quantizing step $q$; $(p(n) \geq q)$, then the output number $z(n)$ of adder 4 is again rounded upwards in device 6. If on the other hand $p(n)$ is smaller than or equal to $-q$; $(p(n) \leq -q)$; then, the output number $z(n)$ of adder 4 is again rounded downwards. If, however, the value of the number $p(n)$ is situated between $-q$ and $+q$; $(-q < p(n) < q)$, then magnitude truncation is applied upon the output number $z(n)$ of adder 4.

It must be observed that in the embodiment shown in FIG. 1 also the numbers $ay(n-1)$ and $-2[ay(n-1) + by(n-2)]$ may be supplied to adder 9 instead of the numbers $y(n-2)$ and $-ay(n-1) - by(n-2)$. These numbers may be derived from the output of multiplier 3(0) and multiplier 10 respectively while a multiplication factor $-2$ must then be supplied to the latter. In this case the output number of adder 9 is given by $p(n) = ay(n-1) - 2[ay(n-1) + by(n-2)]$. If also in this case $p(n) \geq q$, then the output number $z(n)$ of adder 4 is again rounded upwards, if $p(n) \leq -q$ rounding downwards occurs again and if $|p(n)| < q$ then again magnitude truncation is applied upon the output number $z(n)$ of adder 4.

Also the above equation $p(n) = ay(n-1) - 2[ay(n-1) + by(n-2)]$ may be derived from an energy concept and in particular when, in agreement with reference (h) an energy matrix $w$ is chosen to be equal to:

$$w = \begin{bmatrix} 2 & -a \\ -a & \gamma \end{bmatrix}$$

where $\gamma$ is a function of the filter coefficients $a$ and $b$.

3. Description of FIG. 3

FIG. 3 shows the so-called transpose configuration of the filter shown in FIG. 1. In this FIG. 3 elements corresponding with FIG. 1 are indicated by the same reference numerals. Also in this embodiment quantizer 6 has been included in the circuit which is formed by the output of adder 4 and the input of the delay section 2(0) and it is also arranged to apply either rounding or magnitude truncation upon the output numbers of adder 4.

In the embodiment shown the control of the quantizer 6 is effected in dependence upon the numbers $-y_2(n)$ and $-[ay_1(n)+y_2(n)]$ which are derived from the delay section 2(1) and adder 4 via respectively multiplying devices 19 and 20 having multiplication factors $-1$.

If the number supplied by adder 9 is again represented by $p(n)=-ay_1(n)-2y_2(n)$ and the number supplied by adder 4 by $z(n)=ay_1(n)+y_2(n)$, then again the number $z(n)$ is rounded upwards in quantizer 6 if $p(n)$ is greater than or equal to one quantization step $q$; $(p(n) \geq q)$. The number $z(n)$ is rounded downwards if $p(n)$ is smaller than or equal to $-q$; $(p(n) \leq -q)$ and magnitude truncation is again applied upon $z(n)$ if the absolute value of $p(n)$ is smaller than $q$ quantization step ($|p(n)|<q$).

In this recursive digital filter the number $p(n)=-ay_1(n)-2y_2(n)$ can also be obtained by adding the number $ay_1(n)$ occurring at the output of multiplier 3(0) and the number $y_2(n)$ which was multiplied by a factor two and which occurs at the output of the delay section 2(1) and by multiplying the output number of adder 9 thus obtained by a factor minus 1 ($-1$).

4. Description of FIG. 4.

Figure 4:
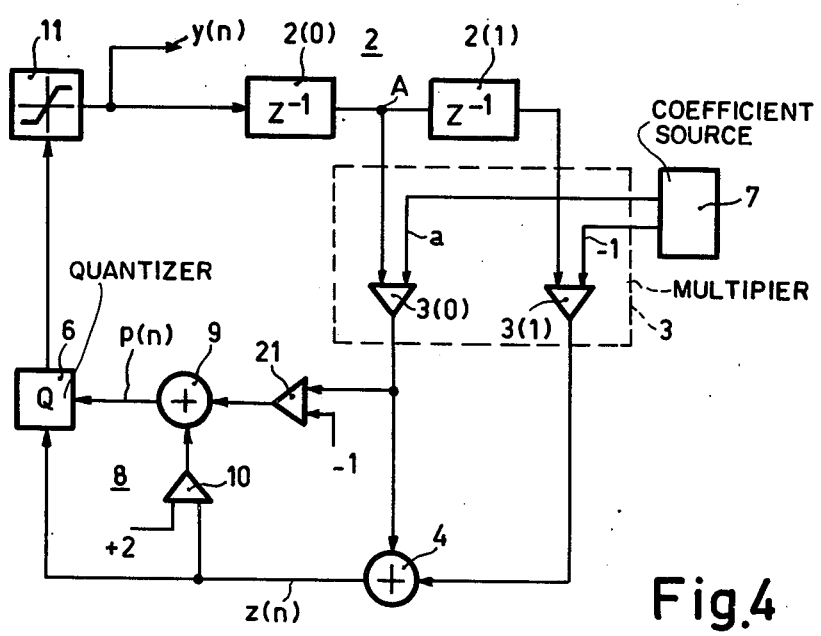
FIG. 4 shows a second-order digital oscillator provided with the measures according to the invention.

As has already been observed a signal processing device described above can also constitute a digital oscillator. FIG. 4 shows an embodiment of such a digital oscillator. In particular this FIG. 4 shows a second-order digital oscillator which is arranged for generating digitally coded samples of a sinusoidal signal.

In contradistinction to the described recursive digital filters, a digital oscillator is arranged to generate a limit cycle, which corresponds to the desired sinusoidal signal.

The circuit of the digital oscillator shown in FIG. 4 corresponds to a very great extent to the digital filter shown in FIG. 1. Consequently, elements in FIG. 4 corresponding to elements in FIG. 1 are indicated with the same reference numerals.

Multiplication factors $a$ and $b$ are supplied to multipliers 3(0) and 3(1) respectively. The multiplication factor $a$ determines the period of the desired sinusoidal signal. As usual the multiplication factor $b$ is chosen to be equal to the value $-1$, which causes an undamped oscillation.

In this digital oscillator, in which the register section 2(0) and 2(1) are arranged for storing numbers whose magnitude, do not exceed a certain maximum value $y_{max}(n)$, for example the value 0,5, it is common practice to use a non-linear processor for processing the output numbers of quantizer 6 in such a way that an output number of device 6 whose magnitude exceeds the said maximum value $y_{max}(n)$ is replaced by a number whose magnitude is equal to $y_{max}(n)$. Such a processing is known as saturation processing and is symbolically indicated in FIG. 4 by the device 12 (saturation device). (See also references (h) and (i).)

As this saturation processing is outside the scope of the invention we refrain here from a further description of this processing as well as of the description of the processor.

In the digital oscillator of FIG. 4 the quantizer 6 is arranged for rounding upwards or downwards the numbers supplied by the adder 4 which rounding takes place in dependence upon the number supplied by control circuit 8. In conformity with FIG. 1 this control circuit comprises the adder 9 and the multiplier 10. The numbers $-ay(n-1)$ and $+2[ay(n-1)+by(n-2)]$ are now applied to this adder 9, which in response thereto produces the number $p(n)=-ay(n-1)+2[ay(n-1)+by(n-2)]$. These numbers applied to adder 9 are derived from the output of multiplier 3(0) via a multiplier 21 and from the output of adder 4 via the multiplier 10 respectively. The multiplication factors $+2$ and $-1$ are applied to the multipliers 10 and 21 respectively.

With this digital oscillator, where no magnitude truncation is applied the output number $z(n)$ of adder 4 is again rounded upwards if $p(n)$ is positive ($p(n)>0$) and $z(n)$ is rounded downwards if $p(n)$ is negative ($p(n)<0$).

By using the measures according to the invention it is achieved that the polarity of the round off error $E_n$ is always equal to the polarity of the number $p(n)$ supplied by adder 9. A stable digital oscillator is now realised which can only generate a sinusoidal oscillation having only one predetermined amplitude.

The conditions for a stable digital oscillator can again be derived from an energy concept (see for example reference (f), (g) and (h)). As $b=-1$, both previously mentioned energy matrices get the same form. Namely, for this value of $b$ both these matrices change into $$w = \begin{bmatrix} 2 & -a \\ -a & 2 \end{bmatrix}$$

It follows from this energy concept that a digital oscillator can generate a sinusoidal signal having only one specified amplitude if the equation $E_n [ay(n-1)-2y(n-2)] \geq 0$ is satisfied, which has been attained with the described measures according to the invention.

In addition to the manner described above the output number $p(n)$ of adder 9 can also be obtained by applying the output number of multiplier 3(1) and the output number of adder 4 directly to this adder 9. It is also possible, to add the output number of multiplier 3(0) to the output number of multiplier 3(1), multiplied by a factor 2.

The digital oscillator of FIG. 4 can be converted to its transpose configuration in the same way as indicated for the digital filter of FIG. 1. In such a construction of the digital oscillator the quantizer 6 is controlled in the same way as described with reference to FIG. 3 in which case, however, again no magnitude truncation is applied.

5. Description of FIG. 5

Figure 5:
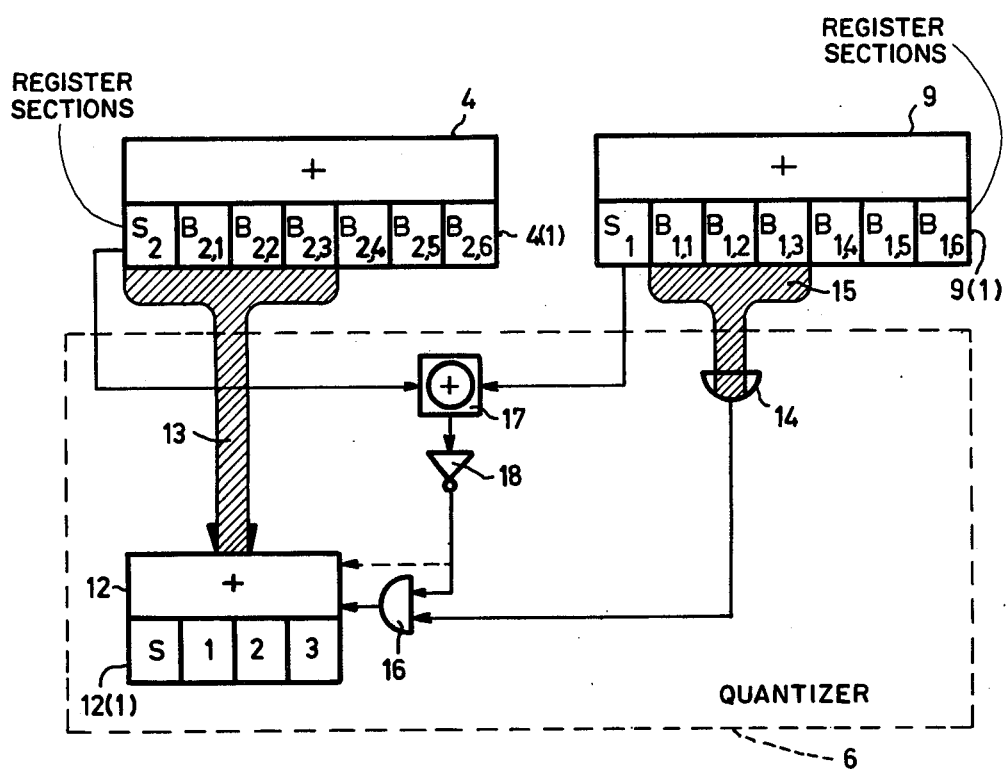
FIG. 5 shows an embodiment of a controlled quantizer.

FIG. 5 shows an embodiment of a quantizer 6 which is arranged for round or for applying magnitude truncation to the numbers $z(n)$ produced by adder 4 under the control of the numbers $p(n)$ produced by the adder 9 of control circuit 8. For the sake of completeness, this FIG. 5 shows symbolically the adder 4 provided with an output register 4(1) and the adder 9 provided with an output register 9(1). For simplicity it is assumed that these adders 4 and 9 produce seven-bit numbers in sign and magnitude representation. Accordingly, the output registers 4(1) and 9(1) comprise seven register sections which have only been symbolically designated in the figure by $S_1$, $S_2$, $B_{1,1}$ —$B_{1,6}$ and $B_{2,1}$ —$B_{2,6}$. Herein $S_1$ is the polarity bit of $p(n)$; $S_2$ is the polarity bit of $i.z(n)$; $B_{1,1}$—$B_{1,6}$ are the magnitude bits of $p(n)$; $B_{2,1}$—$B_{2,6}$ are the magnitude bits of $z(n)$. These bits $B_{r,1}$—$B_{r,6}$ where $r=1$ or 2, herein stand for the values $(½)^1$, $(½)^2$, ... $(½)^6$ respectively.

In the embodiment of the quantizer shown here the number $z(n)$ which consists of six magnitude bits is converted to a number which consists of only three magnitude bits. Those sections of the output register 4(1) comprising the bits $B_{2,1}$—$B_{2,3}$ therefore are connected in parallel to the input circuit of an adder 12 which is provided with an output register 12(1). In this figure these connections are schematically indicated by the hatched region 13. At the same time the three sections of the output register 9(1) which contain the bits $B_{1,1}$—$B_{1,3}$ are connected in parallel to the input circuit of an OR gate 14 which supplies a binary "1" if at least one of the bits $B_{1,1}$—$B_{1,3}$ has the value "1". In the figure the latter parallel connections are schematically indicated by the hatched region 15. Via a first input of an AND gate 16 the output of the OR gate 14 is connected to the least significant bit input of a second input circuit of the adder 12. Only when this AND gate 16 supplies a binary "1", a number having a value which is equal to one quantization step $q$ (=$(1/2)^3$) is added in the adder 12 to the number which is applied to this adder 12 via the hatched region 13. Furthermore, in the quantizer shown the polarity bits $S_1$ and $S_2$ is supplied to a modulo-2-adder 17 whose output is connected to a second input of the AND gate 16 via an inverter 18.

As in this embodiment of the quantizer, besides the sign bit $S_2$ only the three most significant magnitude bits $B_{2,1}$—$B_{2,3}$ of the number $z(n)$ are applied to the device 12, this number $z(n)$ is magnitude truncated. In the quantizer shown use has now been made of the knowledge that rounding downwards of a positive number and rounding upwards of a negative number corresponds to the application of magnitude truncation to that number. If the number which is supplied to the adder 12 via the region 13 is designated by $z_t(n)$, i.e. the magnitude-truncated value of $z(n)$ than the AND gate 16 supplies a binary "1" of the absolute value $|z(n)|$ of $z(n)$ must be rounded upwards. If $|z(n)|$ must be rounded downwards or if magnitude truncation must be applied to it than the AND gate 16 supplies a binary "0".

If now in particular the sign of a positive number is designated by a "0"-bit and of a negative number by a "1"-bit; if the magnitude of $p(n)$ which is characterized by the bits $B_{1,1}$—$B_{1,6}$ is given by $|p(n)|$; the magnitude of $z(n)$ characterized by the bits $B_{2,1}$—$B_{2,6}$ by $|z(n)|$; the magnitude of the number which is applied to adder 12 via the region 13 by $M = |z_t(n)|$ and the magnitude of the quantized output number of the quantizer by $|z_{kw}(n)|$ then the quantizer shown in FIG. 5 operates as is shown in the Table I below. It is observed that the sign of the number to be quantized is not changed by the quantizing operation so that the sign of $z_{kw}(n)$ remains equal to $S_2$.

TABLE I

| $S_1$ | p(n) | $S_2$ | $|z_{kw}(n)|$ |
|---|---|---|---|
| 0 | ≥ q | 0 | M + q |
| 0 | ≥ q | 1 | M |
| 1 | ≥ q | 0 | M |

TABLE I-continued

| $S_1$ | p(n) | $S_2$ | $|z_{kw}(n)|$ |
|---|---|---|---|
| 1 | ≥ q | 1 | M + q |
| — | < q | 0 | M |
| — | < q | 1 | M |

In the case of the embodiment shown in the FIGS. 1 and 4 in which no magnitude truncation is applied to the numbers $z(n)$, the quantizer shown in FIG. 5 must be the OR gate 14, the connections 15 shown in the hatched area and the AND gate 16 can be deleted from the quantizer shown in FIG. 5. In that case the output of the inverter 18 is connected direct to said least significant bit input of the second input circuit of the adder 12. The latter connection is indicated in FIG. 5 by means of a dashed line. The quantizer obtained in this way operates now as indicated in Table II below.

TABLE II

| $S_1$ | $S_2$ | $|z_{kw}(n)|$ |
|---|---|---|
| 0 | 0 | M + q |
| 0 | 1 | M |
| 1 | 0 | M |
| 1 | 1 | M + q |

GENERAL REMARKS

In the embodiment shown quantizer 6 may also be included in another place in the digital signal processing device. For example in FIG. 1 the device 6 may be included between adder 1 and shift register section 2(0), or between shift register section 2(0) and the point A indicated in FIG. 1. Also for the digital filter shown in FIG. 3 the quantizer 6 may be included between the shift register section 2(0) and the point also indicated by A in the FIG. 3. For the digital oscillator shown in FIG. 4 the quantizer 6 may also be included between the saturation device 11 and the shift register section 2(0) or between the output of the shift register section 2(0) and the point which is again indicated by A and which is located between the two shift register sections 2(0) and 2(1).

As the control of the various elements shown in the embodiments of the signal processing device is effected in the usual and obvious way, for one skilled in the art, we have here refrained from a description of this control; furthermore the construction of such a control is outside the scope of the invention.

In FIG. 1 memory means such as a ROM may be used instead of the multiplier device 3. In that case the numbers stored in the storage sections 2(0) and 2(1) are each used as address codes for this ROM, for example in the way as described in detail in reference (j).

Although the shown embodiments are based on numbers which are given in sign and magnitude, the measures according to the invention, may also be used in digital signal processing devices of the type described wherein the numbers are represented in another way such as, for example, in two's complement.

Finally it is observed that the described recursive digital filter can be combined in usual manner with other recursive and non-recursive digital filters in order to realize high-order digital filters.

What is claimed is:

1. A digital signal processing device comprising:

supply means for supplying a sequence of code word signals;

coefficient storage means for storing predetermined weighting coefficients;

multiplying means for multiplying ones of said code word signals by ones of said weighting coefficients and producing a sequence of output signals; and first combination means for combining two sequences of signals from said multiplying means, and producing an output signal;

feedback means for feeding back a quantized representation of said output signals to said supply means, comprising a quantizer having a first and second input, and an output connected to said supply means, and second combination means for combining said output signal of said digital multiplier with a sequence of code word signals from said supply means, and producing an output signal for controlling said quantizer.

2. A digital signal processing device as claimed in claim 1, wherein said quantizer is arranged to round downwards the code words signals produced by said first combination means if the simultaneously occurring output code word of said second combination means has a value which is smaller than a predetermined number.

3. A digital signal processing device as claimed in claim 1, wherein said quantizer is arranged to round upwards the code words signals produced by said first combination means if the simultaneously occurring output code word of said second combination means has a value which is greater than a predetermined number.

4. A digital signal processing device as claimed in claim 3, wherein said quantizer applies magnitude truncation to code words produced by said first combination means, if the simultaneously occurring output codeword of the second combination means has a value which is smaller than a given first number and greater than a given second number, said second number having a value which is smaller than said first number.

5. A digital signal processing device as claimed in claim 4, wherein said first and said second number have equal absolute values each equal to one quantization step.

* * * * *